United States Patent [19]

Miyake

[11] Patent Number: 5,179,353
[45] Date of Patent: Jan. 12, 1993

[54] POWER CONTROL CIRCUIT USED FOR BOTH ANALOG/DIGITAL DUAL MODE

[75] Inventor: Atsushi Miyake, Hyogo, Japan

[73] Assignee: Mitsubishi Denki Kabushiki Kaisha, Tokyo, Japan

[21] Appl. No.: 789,829

[22] Filed: Nov. 8, 1991

[30] Foreign Application Priority Data

Oct. 1, 1991 [JP] Japan .................................. 3-012496

[51] Int. Cl.$^5$ ............................................. H03G 3/20
[52] U.S. Cl. .................................. 330/129; 330/134;
330/138; 330/144; 330/279; 330/284; 375/98;
455/116; 455/126
[58] Field of Search ............... 330/127, 129, 133, 134,
330/138, 144, 145, 279, 284; 455/116, 127, 126;
375/58

[56] References Cited

U.S. PATENT DOCUMENTS 4,518,927  5/1985  Koppe et al. ........................ 330/284
4,523,155  6/1985  Walczak et al. ..................... 330/279

FOREIGN PATENT DOCUMENTS 63-219212  9/1988  Japan .

*Primary Examiner*—James B. Mullins
*Attorney, Agent, or Firm*—Rothwell, Figg, Ernst & Kurz

[57] ABSTRACT

A power control circuit used for both analog/digital dual mode is disclosed which comprises a switching circuit (17) for applying the feedback signal to the gain control terminal (40) of the power amplifier (2) and applying a fixed bias voltage to the attenuation control terminal (30) of the attenuator (10) so that the amplifier operates as a C class amplifier in the case of analog mode, and for applying the feedback signal to the attenuation control terminal (30) of the variable attenuator (10) and applying the predetermined bias voltage to the gain control terminal (40) of the power amplifier (2) so that the amplifier operates as an A class amplifier in the case of digital mode. In the present invention, as a single amplifier operates for both analog mode and digital mode, the configuration is simplified and assembled cheaply.

3 Claims, 3 Drawing Sheets

POWER CONTROL CIRCUIT USED FOR BOTH ANALOG/DIGITAL DUAL MODE

BACKGROUND OF THE INVENTION

1. Field of the Invention

The invention relates to a power control circuit which amplifies the modulated radio frequency (RF) signal according to the C class amplification of the analog mode or A class amplification of the digital mode. In particular, the present invention relates to automatic power control (APC) of the modulated RF signal.

2. Description of the Prior Art

FIG. 3 shows a block diagram of the conventional power amplifier having APC functions and operating as C class power amplifier. In FIG. 3, a modulated RF signal 1 is the signal to be amplified. A power amplifier 2 amplifies the RF signal. The gain of the power amplifier 2 is controlled by a signal applied to a gain control terminal 40. A signal 3 is the output signal from the power amplifier 2. A detector 4 detects the power level of the RF output signal 3. A comparator 5 generates a feedback signal by comparing the detected signal received from the detector 4 and the standard voltage. A level switching signal 6 is a predetermined voltage level which is provided for switching the standard voltage. A standard voltage generator 7 generates a standard voltage corresponding to the output level switching signal 6. A low pass filter 8 eliminates the influences of the output noises received from the comparator 5. A feedback signal 9 is an output signal from the low pass filter 8 in which the noises are eliminated by the low pass filter 8.

The operation of the above conventional art is explained hereinafter. In FIG. 3, the modulated RF signal 1 is inputted directly to the power amplifier 2 and is amplified up to a predetermined level and is outputted as a RF output signal 3. The RF output signal 3 must be within a predetermined level even if the RF input level 1 or the power source voltage happens to fluctuate.

Accordingly, it is necessary to observe the level of the RF output signal 3 and to feed back the detected signal to the amplifier 2 so that the fluctuation level is within a predetermined level. The level of the RF output signal 3 is detected in the detector 4 and the detected signal is inputted to the comparator 5. The detected signal is compared with the standard voltage in the comparator 5. The standard voltage is generated in the standard voltage generator 7 corresponding to the output level switching signal 6. The comparator 5 compares the detected level and the standard voltage and outputs the difference signal of the two. The difference signal passes through the low pass filter 8 where its influences of the noises is eliminated and it then becomes feedback signal 9. The feedback signal 9 is applied to the gain control terminal 40 to control the gain of the power amplifier 2. That is, if the power of the RF signal decreased, the feedback signal 9 operates so that the gain of the power amplifier will be increased, and if the power of the RF signal is increased, the feedback signal 9 operates so that the gain of the power amplifier 2 will be decreased. According to the above operations, the output power 3 of the power amplifier is maintained constant.

FIG. 4 shows a block diagram of the conventional power amplifier having automatic power control (APC) functions and operating as A class power amplifer. In FIG. 4, a variable attenuator 10 attenuates the modulated RF signal 1 in response to the signal applied to an attenuation control terminal 30. A bias switching device 11 supplies a bias voltage to a gain control terminal 40 of power amplifier 2 so that the power amplifier 2 operates at an optimum condition as an A class amplifier. The same reference numbers as used in FIG. 3 apply to the same portions or the corresponding portions of FIG. 4. Accordingly the detailed explanation of these portion is omitted in connection with the same reference numbers.

The operation of the above conventional art amplifier is explained hereinafter. In FIG. 4, the modulated RF signal 1 is inputted to the variable attenuator 10 and the attenuation factor is controlled by applying the feedback signal 9 to the attenuation control terminal 30. The attenuated RF signal is inputted to the power amplifier 2 and amplified in the power amplifier 2. The power amplifier 2 operates at an optimum gain condition as an A class amplifier by applying the bias voltage to the gain control terminal 40 from bias switching device 11. That is, if the power of the RF signal 3 is decreased, the feedback signal 9 operates so that the attenuation will be decreased, and if the power of the RF signal increased, the feedback signal 9 operates so that the attenuation will be increased. According to the above operation, the RF output power 3 of the power amplifier 2 is maintained constant.

As the conventional power control circuit is constructed as explained above, the characteristic of linearity is difficult to maintain in connection with the C class amplifier such as shown in FIG. 3. Also, the amplifier of FIG. 3 generates distortion if the amplifier is used as a digital amplifier such as for $\pi/4$ shift quadrature phase shift keying ($\pi/4$ shift QPSK). Further the amplifier of FIG. 4 shows low efficiency if the amplifier is used as an analog amplifier such as for frequency modulated (FM) signals having constant envelope, because the amplifier operates as a linear amplifier. Accordingly it is difficult to obtain a power amplifier which can be used for both analog mode and digital modes.

It is a primary object of the present invention to provide a single power amplifier which can be used for both analog mode and digital modes.

It is further object of the present invention to provide an effective C class operation in an analog mode, and to provide a low distortion linear characteristic for A class operation in the digital mode.

SUMMARY OF THE INVENTION

A power control circuit useful for both analog/digital dual mode of the present invention includes (as shown in FIG. 1) a power amplifier for amplifying a RF signal as controlled by the signal applied to a gain control terminal, a variable attenuator for attenuating the RF signal as controlled by a signal applied to a attenuation control terminal, a detector for detecting a power level of the RF output signal, and a comparator for generating a feedback signal by comparing a detected signal obtained from the detector with a standard voltage generator. The power control circuit used for both analog/digital dual mode also includes a switching circuit. The switching circuit applies the feedback signal to the gain control terminal of the power amplifier, and a fixed bias voltage to the attenuation control terminal of the variable attenuator, so that the amplifier operates as C class amplifier in the case of the analog mode. The switching circuit also applies the feedback signal to the attenuation control terminal of the variable attenuator and the predetermined bias voltage to the gain control terminal of the power amplifier, so that the amplifier operates as A class amplifier in the case of the digital mode.

DETAILED DESCRIPTION OF THE PREFERRED EMBODIMENTS

Figure 1:
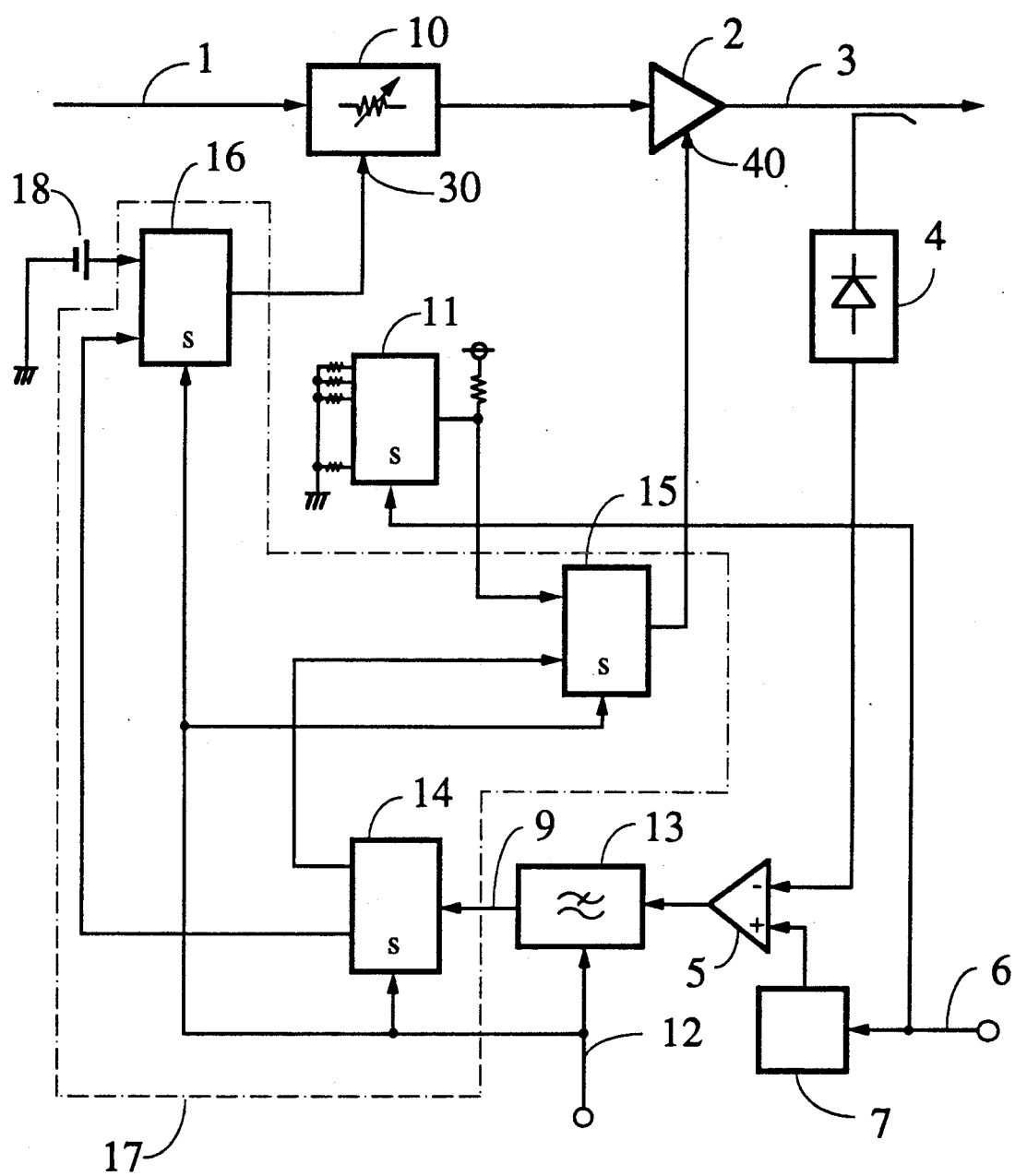
FIG. 1 is a block diagram of a first embodiment of the present invention.

FIG. 1 shows a first embodiment of the present invention. In FIG. 1, a modulated radio frequency (RF) signal 1 is an input signal which is amplified by a power amplifier 2. THe power amplifier 2 amplifies the RF signal under the control of a signal applied to a gain control terminal 40. Signal 3 is the output signal from the power amplifier 2. A detector 4 detects the power level of the RF output signal 3. A comparator 5 generates the feedback signal by comparing the detected signal obtained from the detector 4 with the standard voltage. An output level switching signal 6 is set at a predetermined level which is applied for selecting a plurality of standard voltages. A standard voltage generator 7 outputs a standard voltage corresponding to the output level switching signal 6. A feedback signal 9 is outputted in which the influences of the output noises are eliminated by the low pass filter 13. A variable attenuator 10 controls the attenuation of the RF signal 1 in response to a signal applied to an attenuation control terminal 30. A bias switching device 11 supplies the bias voltage to the attenuation control terminal 40 of the power amplifier 2 so that the power amplifier 2 operates at an optimum condition as an A class amplifier in the case of the digital mode. An analog/digital switching signal 12 operates to switch the amplifier mode either for the analog mode or the digital mode. The low pass filter 13 eliminates the influences of the output noises and the fluctuation component from the comparator 5. A selector 14 switches the feedback signal 9 to a selector 15 or a selector 16. The selector 15 switches the feedback signal 9 received from the selector 14 and a bias voltage from the bias switching device 11 to the gain control terminal 40 of the power amplifier 2 according to the output level of switching signal 6. The selector 16 switches the feedback signal 9 received from the selector 14 and a fixed bias voltage supplied from a bias battery 18 to the attenuation control terminal 30 of the attenuator 10 responsive to the analog/digital switching signal 12. A switching circuit 17 is constructed of the selectors 14, 15 and 16. The switching circuit 17 supplies the feedback signal to the gain control terminal 40 of the power amplifier 2, and also supplies the fixed bias to the attenuation control terminal 30 of the attenuator 10 while the amplifier (2) operates in the analog mode. On the other hand, the switching circuit 17 supplies the bias voltage to the gain control terminal 40 of the power amplifier 2, and also supplies the feedback signal to the attenuation control terminal 30 of the attenuator 10 when the amplifier (2) operates in the digital mode.

The operation of the first embodiment is explained hereinafter. In FIG. 1, the analog mode operation and the digital mode operation of the amplifier 2 are explained separately hereinafter for the sake of easy understanding of the present invention.

(1) Analog mode operation of the amplifier 2.

In the case of analog mode, the RF input signal 1 is amplified by the power amplifier 2. The magnitude of the RF output signal 3 is detected in the detector 4 and the detected signal is inputted to the comparator 5. The detected signal is compared with the standard voltage which is supplied from the standard voltage generator 7, in the comparator 5. The standard voltage is generated in the standard voltage generator 7 in response to the switching signal 6. The comparator 5 outputs the difference voltage which is a difference voltage between the detected signal from the detector 4 and the output voltage of the standard voltage generator 7. The difference signal outputted from the comparator 5 passes through the low pass filter 8. The output noise from the comparator 5 are eliminated to yield the feedback signal 9. The feedback signal 9 is applied to the gain control terminal 40 of the power amplifier 2 through the selectors 14 and 15 and controls the gain of the power amplifier 2 responsive to the analog/digital switching signal 12. On the other hand, the attenuation of the attenuator 10 is constant (for example, attenuation is zero) and has no relation to the APC operation, because the selector 16 supplies a fixed bias voltage to the attenuation control terminal 30 of the attenuator 10 responsive to the analog/digital switching signal 12.

Therefore, the RF signal 3, in other words the output power, is controlled by applying the feedback signal to the gain control terminal 40 of the power amplifier 2. That is, if the power of the RF signal 3 is decreased, the feedback signal 9 operates so that the gain of the power amplifier 2 will be increased, and if the power of the RF signal is increased, the feedback signal 9 operates so that the gain of the power amplifier 2 will be decreased. The above operation makes the RF signal output power constant. As the constant envelope FM modulations are carried out in the analog mode, the effective amplification for such mode is attained without being influenced by variations in the operation point of the amplifier 2.

(2) Digital mode operation of the amplifier 2.

In the case of the digital mode, $\pi/4$ shift QPSK has one set of 4 signal points (0, $\pi/2$, $\pi$, $3\pi/2$) and one other set of signal points ($\pi/4$, $3\pi/4$, $5\pi/4$, $7\pi/4$) which are shifted by $\pi/4$ from the first set of signal points, and these two sets of signal points are used alternately for every two bits.

Therefore, every time the signal point changes, the carrier wave changes discontinuously and the amplitude modulation component is generated. Accordingly, if the amplifier operates in the C class operation of the analog mode, the amplitude modulation component produces phase distortion and mutual modulation distortion.

In the case of digital mode, the process for detecting the RF output signal by the detector 4 and comparing the detected signal with the standard voltage is the same as with the process in the analog mode. The difference signal which is outputted from the comparator 5 is inputted to the low pass filter 13. The time constant of the low pass filter 13 is controlled so as to be larger than that in the analog mode by means of the analog/digital switching signal 12 so that the influence of fluctuations in the detected voltage accompanying the modulation is eliminated.

The feedback signal 9 from which the fluctuation component is eliminated is inputted to the selector 14. The selector 14 switches the feedback signal 9 to the selector 16 in response to the analog/digital switching signal 12. The selector 16 selects the feedback signal and provides it to the attenuation control terminal 30 of the attenuator 10 in response to the analog/digital swishing signal 12.

On the other hand, the selector 15 selects the output received from the bias switching device 11 and provides a predetermined bias voltage to the gain control terminal 40 of the power amplifier 2. The bias voltage is selected in response to the output level switching signal 6 so that the amplifier 2 operates efficiently within the range of A class operation, that is within the range of linear operation having no distortion.

Therefore, the RF output signal 3 is controlled by the attenuator 10 which is provided in front of the power amplifier 2. In this case, the power amplifier 2 only operates so as to give a constant gain to the RF input signal 1. Therefore, if the power of the RF signal 3 is decreased, the feedback signal 9 operates so that the attenuation will be decreased, and if the power of the RF signal 3 is increased, the feedback signal 9 operates so that the attenuation will be increased. According to the above operation, the RF output power 3 of the power amplifier 2 is maintained constant.

Figure 2:
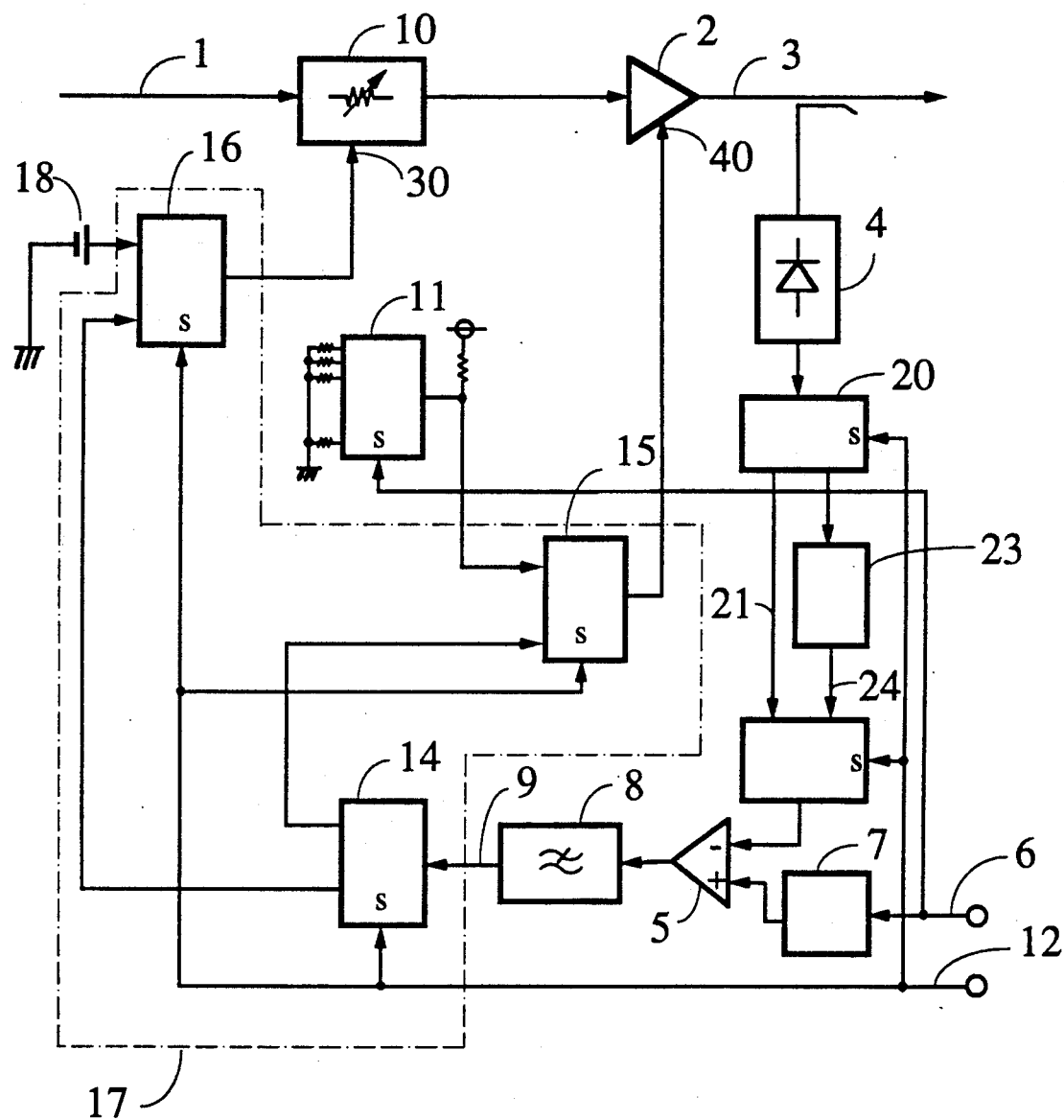
FIG. 2 is a block diagram of a second embodiment of the present invention.
Figure 3:
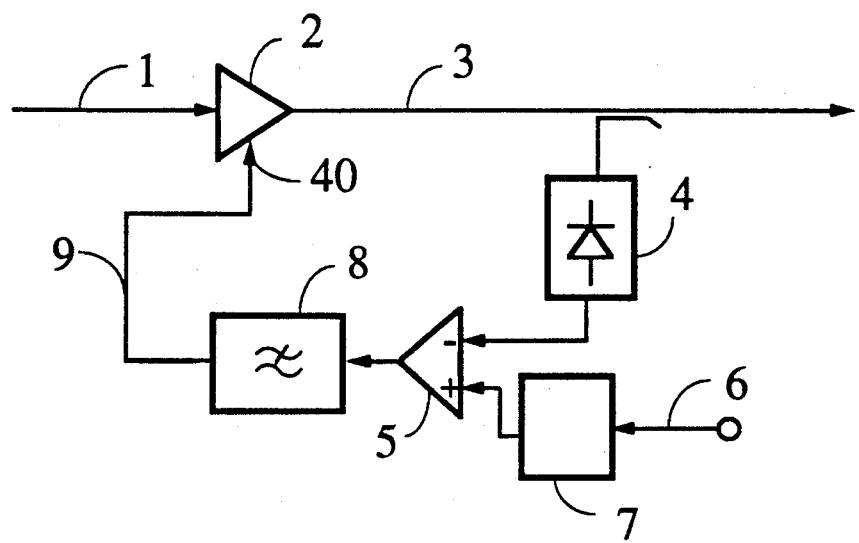
FIG. 3 is a power control circuit for operating a C class amplifier.
Figure 4:
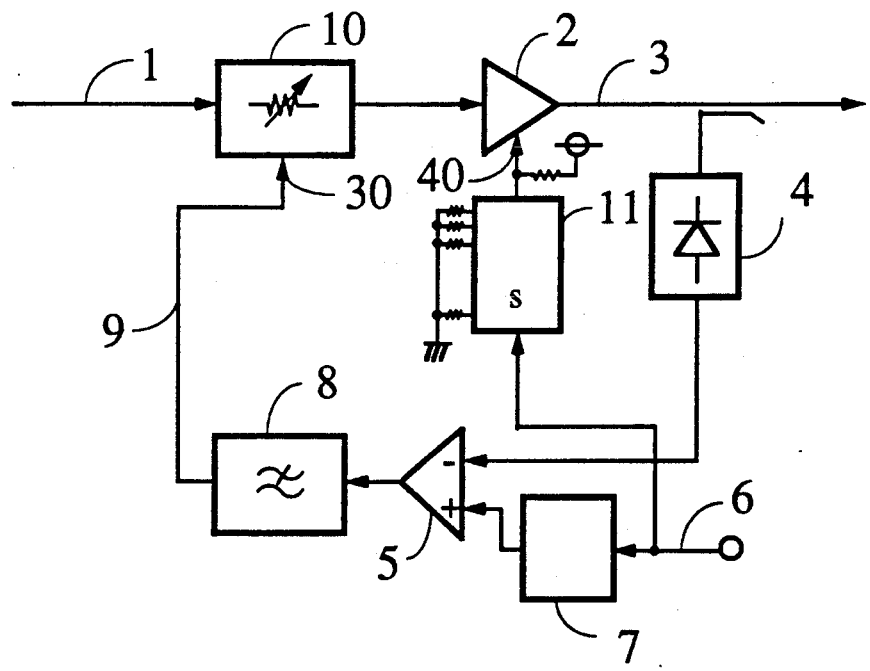
FIG. 4 is a power control circuit for operating an A class amplifier.

FIG. 2 is a block diagram of a second embodiment of the present invention of a power control circuit used for both analog and digital dual mode. In FIG. 2, an elimination circuit for eliminating the fluctuations generated by the modulation is connected to the output of the detector 4. In this case, the low pass filter 13 of FIG. 1 is replaced by the low pass filter 8 which has a small time constant and is used in the analog mode.

In FIG. 2, a selector 20 switches the detected signal in responsive to the analog/digital switching signal 12. Signal 21 is a detected signal which is selected in the case of analog mode. A fluctuation eliminating circuit 23 eliminates the fluctuation component which is included in the detected signal in the case of digital mode. Detected signal 24 is a signal in which the fluctuation component is eliminated by the fluctuation eliminating circuit 23. In FIG. 2, the same reference numbers used in FIG. 1 apply to the same portions or the corresponding portions. Accordingly detailed explanation of those portions having the same number is omitted.

The operation of the second embodiment is explained hereinafter. In FIG. 2, the analog mode operation and the digital mode operation of the amplifier 2 are also explained separately hereinafter for the sake of easy understanding of the present invention.

(1) Analog mode operation of the amplifier 2.

In the case of analog mode, the detected voltage from the detector 4 goes through the selector 20 and 22 and applied to the comparator 5. The operation is otherwise the same as the operation of the embodiment shown in FIG. 1. Therefore the detailed explanation is not required.

(2) Digital mode operation of the amplifier 2.

In the case of digital mode, the detected voltage from the detector 4 is inputted to the fluctuation eliminating circuit 23 through the selector 20. The fluctuation eliminating circuit 23, for example, compares the envelope of the output RF signal 3 with the predetermined envelope calculated from the base band signal. The detected signal of the RF output signal ($\pi/4$ shift QPSK) indicates the envelope of the output RF signal 3. On the other hand, the predetermined envelope is calculated beforehand from the square root of $(I^2+Q^2)$, where I is the in-phase component of the base band signal and Q is the orthogonal component of the base band signal.

That is, the envelope of the RF signal is compared with the predetermined envelope in the fluctuation eliminating circuit 23. In this manner, the difference output of the two envelopes does not contain a fluctuation component generated from the modulation. Accordingly the time constant of the low pass filter can be made small for both the analog and digital modes of operation. As the other operation is the same as in analog mode, the detailed explanation is omitted.

What is claimed is:

1. A power control circuit useful for both analog and digital dual modes comprising;
   a power amplifier for amplifying a RF signal by a signal applied to a gain control terminal;
   a variable attenuator for attenuating the RF signal by a signal applied to a attenuation control terminal;
   a detector for detecting a power level of a RF output signal;
   a comparator for generating a feedback signal by comparing a detected signal obtained from the detector with a standard voltage obtained from a standard voltage generator;
   a switching circuit for applying the feedback signal to the gain control terminal of the power amplifier and applying a fixed bias voltage to the attenuation control terminal of the attenuator, so that the amplifier operates as a C class amplifier in the case of analog mode, and for applying the feedback signal to the attenuation control terminal of the variable attenuator and applying a predetermined bias voltage to the gain control terminal of the power amplifier so that the amplifier operates as an A class amplifier in the case of digital mode.

2. A power control circuit useful for both analog and digital modes of claim 1 in which said RF signal is a modulated signal which has been modulated by a base band signal and in which said detector includes means for generating an output signal which includes an envelope of the output RF signal and further comprising;
   a fluctuation eliminating circuit for comparing said envelope of the output RF signal which is outputted from the detector with a predetermined envelope calculated from the base band signal in the case of the digital mode.

3. A power control circuit useful for both analog and digital dual mode of claim 2; wherein the a fluctuation eliminating circuit calculates beforehand the predetermined envelope from the square root of $(I^2+Q^2)$, where I is the in-phase component of the base band signal and Q is the orthogonal component of the base band signal.

* * * * *

UNITED STATES PATENT AND TRADEMARK OFFICE
CERTIFICATE OF CORRECTION

PATENT NO. : 5,179,353
DATED : January 12, 1993
INVENTOR(S) : Atsushi Miyake It is certified that error appears in the above-identified patent and that said Letters Patent is hereby corrected as shown below:

Column 3, line 23, "THe" should be --The--.

Column 5, line 12, "swishing" should be --switching--.

Column 6, line 12, "I2" should be -- $I^2$ --.

Signed and Sealed this

Twenty-third Day of November, 1993

Attest:

BRUCE LEHMAN

Attesting Officer

Commissioner of Patents and Trademarks